(12) United States Patent
Lee et al.

(10) Patent No.: US 9,716,066 B2
(45) Date of Patent: **\*Jul. 25, 2017**

(54) INTERCONNECT STRUCTURE COMPRISING FINE PITCH BACKSIDE METAL REDISTRIBUTION LINES COMBINED WITH VIAS

(71) Applicant: Intel Corporation, Santa Clara, CA (US)

(72) Inventors: Kevin J. Lee, Beaverton, OR (US); James Y. Jeong, Beaverton, OR (US); Hsiao-Kang Chang, Hillsboro, OR (US); John Muirhead, Portland, OR (US); Adwait Telang, Beaverton, OR (US); Puneesh Puri, Aloha, OR (US); Jiho Kang, Beaverton, OR (US); Nitin M. Patel, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/779,022

(22) PCT Filed: Jun. 29, 2013

(86) PCT No.: PCT/US2013/048792
§ 371 (c)(1),
(2) Date: Sep. 22, 2015

(87) PCT Pub. No.: WO2014/209404
PCT Pub. Date: Dec. 31, 2014

(65) Prior Publication Data
US 2016/0049371 A1 Feb. 18, 2016

(51) Int. Cl.
*H01L 23/538* (2006.01)
*H01L 21/768* (2006.01)
(Continued)

(52) U.S. Cl.
CPC ...... *H01L 23/5384* (2013.01); *H01L 21/6835* (2013.01); *H01L 21/76831* (2013.01);
(Continued)

(58) Field of Classification Search
CPC .......... H01L 23/5384; H01L 21/76831; H01L 21/76843; H01L 21/76871;
(Continued)

(56) References Cited

U.S. PATENT DOCUMENTS 9,112,007 B2 * 8/2015 Lin ...................... H01L 23/528
9,142,510 B2 9/2015 Lee et al.
(Continued)

FOREIGN PATENT DOCUMENTS

JP   2005005322    1/2005
KR   1020080101635  11/2008
(Continued)

OTHER PUBLICATIONS

International Searching Authority, "Notification of Transmittal of the International Search Report," mailed Mar. 31, 2014, in International application No. PCT/US2013/048792.

*Primary Examiner* — Jose R Diaz
(74) *Attorney, Agent, or Firm* — Trop, Pruner & Hu, P.C.

(57) ABSTRACT

A 3D interconnect structure and method of manufacture are described in which metal redistribution layers (RDLs) are integrated with through-silicon vias (TSVs) and using a "plate through resist" type process flow. A silicon nitride or silicon carbide passivation layer may be provided between the thinned device wafer back side and the RDLs to provide a hermetic barrier and polish stop layer during the process flow.

16 Claims, 20 Drawing Sheets

(51) Int. Cl.
  *H01L 23/48* (2006.01)
  *H01L 23/31* (2006.01)
  *H01L 23/00* (2006.01)
  *H01L 21/683* (2006.01)

(52) U.S. Cl.
  CPC .. *H01L 21/76843* (2013.01); *H01L 21/76871* (2013.01); *H01L 21/76898* (2013.01); *H01L 23/3171* (2013.01); *H01L 23/481* (2013.01); *H01L 23/564* (2013.01); *H01L 24/02* (2013.01); *H01L 24/13* (2013.01); H01L 24/03 (2013.01); H01L 24/05 (2013.01); H01L 24/11 (2013.01); H01L 24/16 (2013.01); *H01L 2221/6834* (2013.01); *H01L 2221/68327* (2013.01); *H01L 2224/0239* (2013.01); *H01L 2224/02311* (2013.01); *H01L 2224/02313* (2013.01); *H01L 2224/02331* (2013.01); *H01L 2224/02372* (2013.01); *H01L 2224/0391* (2013.01); *H01L 2224/03424* (2013.01); *H01L 2224/03464* (2013.01); *H01L 2224/03823* (2013.01); *H01L 2224/03825* (2013.01); *H01L 2224/0401* (2013.01); *H01L 2224/05008* (2013.01); *H01L 2224/0508* (2013.01); *H01L 2224/05073* (2013.01); *H01L 2224/05082* (2013.01); *H01L 2224/05083* (2013.01); *H01L 2224/05084* (2013.01); *H01L 2224/05147* (2013.01); *H01L 2224/05155* (2013.01); *H01L 2224/05157* (2013.01); *H01L 2224/05164* (2013.01); *H01L 2224/05548* (2013.01); *H01L 2224/05611* (2013.01); *H01L 2224/05644* (2013.01); *H01L 2224/11002* (2013.01); *H01L 2224/116* (2013.01); *H01L 2224/11334* (2013.01); *H01L 2224/11462* (2013.01); *H01L 2224/11464* (2013.01); *H01L 2224/11823* (2013.01); *H01L 2224/11825* (2013.01); *H01L 2224/131* (2013.01); *H01L 2224/13109* (2013.01); *H01L 2224/13111* (2013.01); *H01L 2224/13116* (2013.01); *H01L 2224/13144* (2013.01); *H01L 2224/13147* (2013.01); *H01L 2224/13562* (2013.01); *H01L 2224/13582* (2013.01); *H01L 2224/13583* (2013.01); *H01L 2224/13611* (2013.01); *H01L 2224/13616* (2013.01); *H01L 2224/13644* (2013.01); *H01L 2224/13647* (2013.01); *H01L 2224/13655* (2013.01); *H01L 2224/13657* (2013.01); *H01L 2224/13664* (2013.01); *H01L 2224/16145* (2013.01); *H01L 2924/13091* (2013.01)

(58) Field of Classification Search
  CPC . H01L 21/76898; H01L 23/48; H01L 23/481; H01L 23/564; H01L 24/02; H01L 2224/02311; H01L 2224/02372; H01L 2224/16145; H01L 2924/13091
  See application file for complete search history.

(56) References Cited

U.S. PATENT DOCUMENTS

| | | |
|---|---|---|
| 2006/0071342 A1 | 4/2006 | Umemoto et al. |
| 2010/0090318 A1 | 4/2010 | Hsu et al. |
| 2010/0276787 A1 | 11/2010 | Yu et al. |

FOREIGN PATENT DOCUMENTS

| | | |
|---|---|---|
| WO | 2013062590 | 5/2013 |
| WO | 2013062593 | 5/2013 |

* cited by examiner

INTERCONNECT STRUCTURE COMPRISING FINE PITCH BACKSIDE METAL REDISTRIBUTION LINES COMBINED WITH VIAS

TECHNICAL FIELD

The present invention relates to three dimensional (3D) packaging, and more particularly to the integration of through-silicon vias (TSVs) into 3D packages.

BACKGROUND 3D packaging concerns system on chip (SOC) and system in package (SIP) configurations. TSV 3D packages may contain two or more chips stacked vertically, with vias through silicon substrates replacing edge wiring to create an electrical connection between the circuit elements on each chip.

Standards, such as the Joint Electron Devices Engineering Council's (JEDEC) JEDEC "Design Registration-Micropillar Grid Array (MPGA)", DR-4.26A, December 2011, Item 11.2-845(R), define the chip-to-chip landing pad interface for a logic-to-memory interface. Conventionally, the physical locations of TSVs are located directly beneath the landing pad locations on a chip, which takes up a great deal of die area. This means that all other circuitry is laid out around the TSV locations.

During TSV processing, the array of TSVs are formed through a thinned device wafer. Conventional TSV structures use either silicon dioxide or polymers as an insulator material on the backside of the thinned device wafer. These materials are not hermetic, and do not provide a robust passivation layer on the backside of the thinned device wafer.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
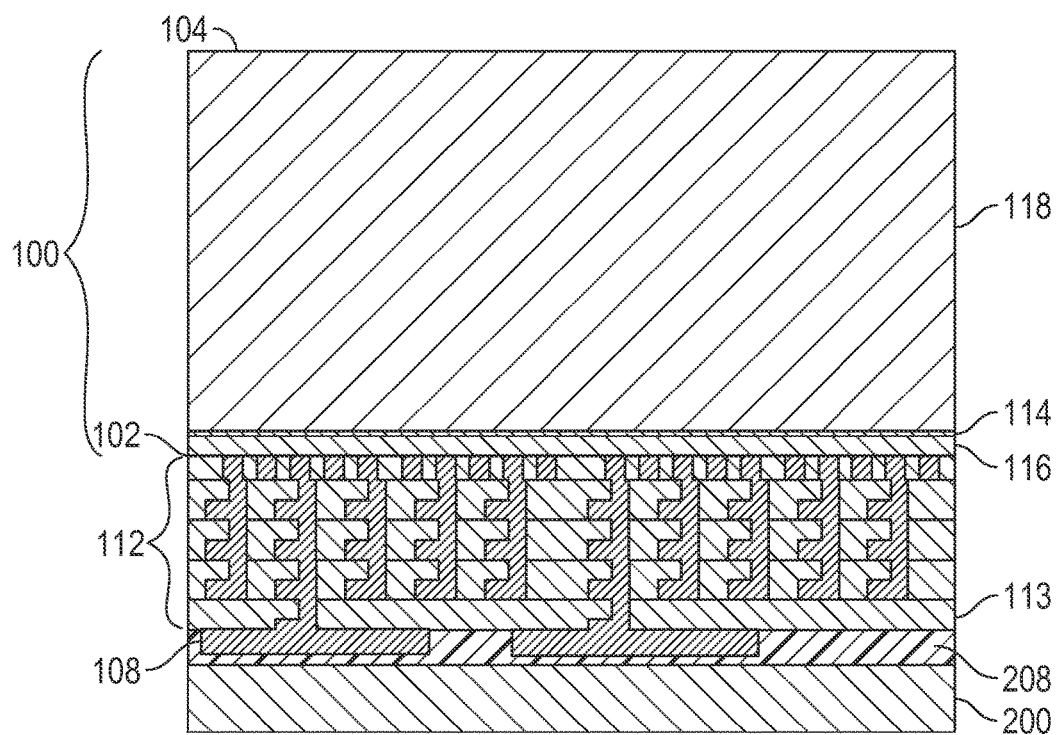
FIGS. 1-17 are cross-sectional side view illustrations of a method of manufacturing a 3D interconnect structure using "plate through resist" processing in accordance with embodiments of the invention.

In various embodiments, a 3D interconnect structure and method of manufacturing a 3D interconnect structure is described. However, certain embodiments may be practiced without one or more of these specific details, or in combination with other known methods and materials. In the following description, numerous specific details are set forth, such as specific materials and processes, etc. in order to provide a thorough understanding of the present invention. In other instances, well-known packaging processes and manufacturing techniques have not been described in particular detail in order to not unnecessarily obscure the present invention. Reference throughout this specification to "an embodiment" or "one embodiment" means that a particular feature, structure, material, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, materials, or characteristics may be combined in any suitable manner in one or more embodiments.

In one aspect, embodiments of the invention describe a 3D interconnect structure and process which combines TSVs with very fine pitch "plate through resist" type (discussed below) backside metal redistribution layers (RDLs). This combination allows for the physical locations of the TSVs to be decoupled from chip-to-chip landing pad locations through the use of RDLs (sometimes referred to herein as RDL lines), thus providing greater circuit layout flexibility. In this manner multiple traces can be run between adjacent landing pad rows or columns. For example, multiple traces may run between adjacent landing pad rows or columns separated by a pitch of 10 μm-500 μm.

Embodiments of the invention allow for a hermetically sealed 3D interconnect structure and a fine pitch RDL architecture, and allow the use of copper metal (as opposed to subtractive etching processes for producing aluminum RDL lines).

Embodiments of the invention describe a silicon nitride or silicon carbide passivation layer which separates backside RDLs from the bulk semiconductor (e.g. silicon) of the thinned device wafer. The silicon nitride or silicon carbide passivation layer may provide a hermetic barrier that protects the backside of the thinned device wafer from trace metal and moisture contamination during TSV and RDL processing.

Furthermore, the backside passivation layer materials such as silicon nitride or silicon carbide may have significantly lower removal rates than the TSV barrier layer materials such as tantalum (Ta), titanium (Ti), tantalum nitride (TaN) or titanium nitride (TiN), so that the passivation layer allows for a large amount of overpolish to be incorporated into a TSV barrier layer chemical mechanical polish (CMP) step without also causing a significant amount of the passivation layer to be removed. Common commercially available barrier layer CMP slurries engineered for the removal of barrier materials such as Ta, Ti, TaN, TiN are also engineered to remove oxides such as silicon dioxide. Thus, in some embodiments, a passivation layer formed of silicon nitride or silicon carbide may be utilized as a polish stop layer when removing the TSV barrier layer between TSVs, thereby protecting the integrity of the TSV structure.

Embodiments describe a manner of integrating plate through resist RDL processing with a TSV structure in which the plate through resist processing may allow for the formation of very fine pitch backside RDLs and greater circuit layout flexibility, while integrating a hermetic barrier passivation layer into the processing sequence which may act as a CMP stop layer during TSV barrier layer removal from between TSVs and provide enhanced reliability performance of the device. The use of plate through resist processing to form RDLs, instead of using single or dual damascene processes, may reduce or eliminate the amount of CMP processing needed to form the RDL. In other words, regarding the formation of the RDL in particular, use of plate through resist processing to form RDLs may reduce expensive Cu and barrier layer CMP processing. For example, forming a top surface of the RDL using plate through resist processing may be done without using CMP for the RDL formation.

While embodiments are described with reference to TSV processing of a silicon device wafer, the embodiments are also applicable to substrates other than silicon wafers, such as compound III-V wafers or II-VI wafers. In addition, it is to be appreciated that while "via last" TSV processing (vias made after metallization structure) is described and illustrated in detail, that embodiments of the invention are not so limited, and that embodiments of the invention may also compatible with "via first" TSV processing (vias made before microelectronic device is formed) and "via middle" TSV processing (vias made between forming microelectronic device and metallization structure). For example, plate through resist RDL processing may also be integrated into via first and via middle TSV processing sequences.

Figure 17:
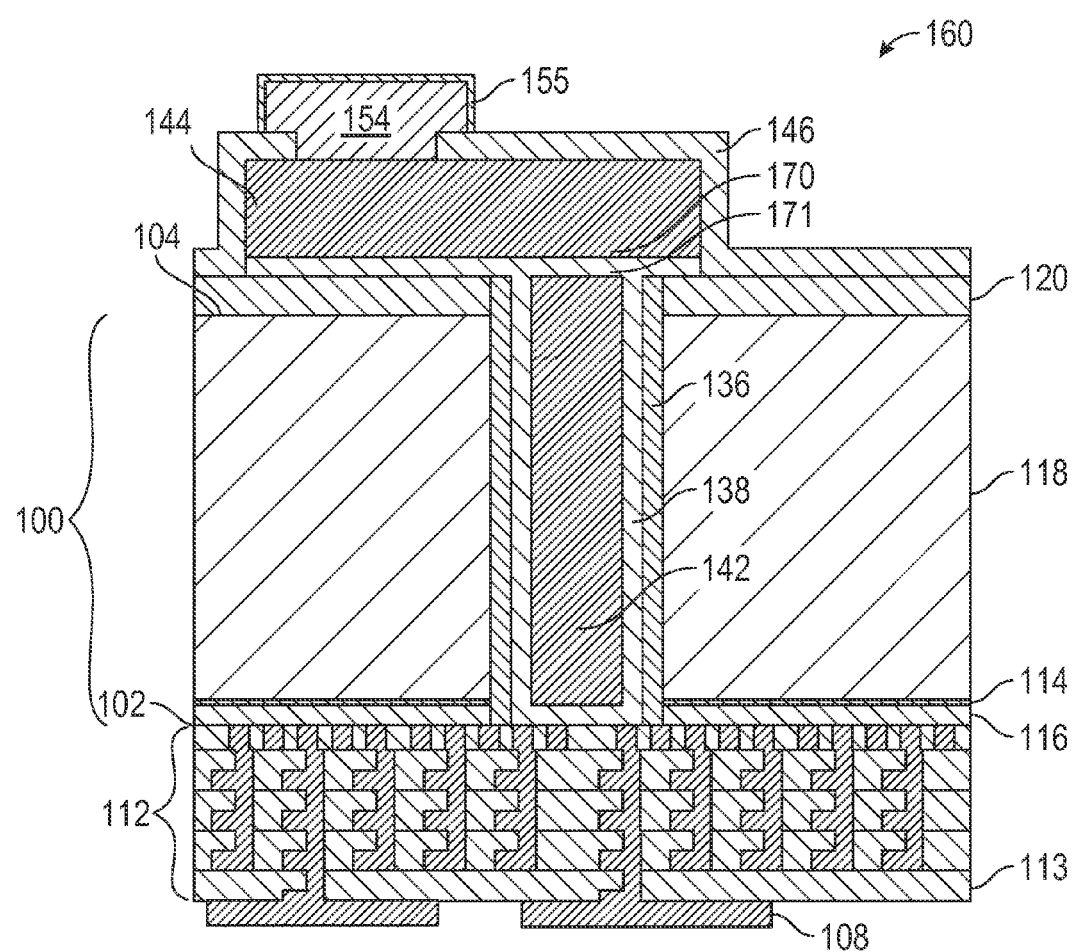

Referring to FIG. 17, in an embodiment a 3D interconnect structure 160 includes a semiconductor substrate 100 having a front surface 102 and a back surface 104, a via (e.g., TSV) 142 extending through the semiconductor substrate 100 between the front 102 and back 104 surfaces, and a plate through resist RDL 144 formed over the back surface 104. A passivation layer 120 may be disposed between the back surface 104 and the RDL 144 to prevent moisture and trace metal contaminants from entering the semiconductor substrate 100. Suitable passivation layer materials may be, for example, silicon carbide and silicon nitride.

In some embodiments, the semiconductor substrate 100 may be a TSV processed device wafer including a plurality of the described 3D interconnect structures. Alternatively, the TSV processed device wafer is singulated to form a plurality of the semiconductor substrates which may or may not be further processed to form a plurality of chips, which may then be integrated into 3D packaging structures. Thus, in an embodiment the 3D interconnect structure 160 is a chip.

In an embodiment the 3D interconnect structure 160 includes an array of landing pads arranged over the back surface 104 in a series of rows and columns. For example, the rows and columns in the array may have a pitch of 10 μm to 500 μm. An array of TSVs, such as TSV 142, may be arranged under the back surface 104 such that the array of TSVs is not arranged in a pattern identical to the array of landing pads. In an embodiment, the array of TSVs is not directly underneath the array of landing pads. In such an embodiment, a plurality of RDLs, such as RDL 144 (sometimes also referred to herein as "RDL line"), may run between two of the rows of the landing pads connecting one of the two rows to a corresponding number of TSVs in the array of TSVs. For example, the two rows of the landing pads may be separated by a pitch of 10 μm to 500 μm. In this manner, RDLs allow for flexibility in the physical locations of the TSVs and circuit layout.

Figure 18:
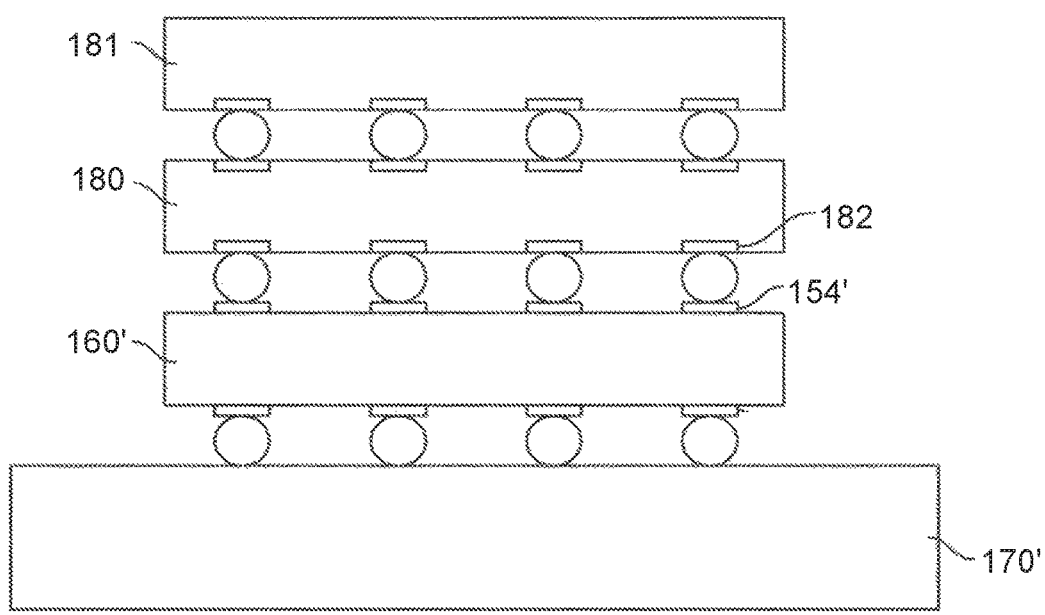
FIG. 18 is a side view illustration of a 3D package implementing TSVs in accordance with embodiments of the invention.

Referring to FIG. 18, in an embodiment a 3D package includes a base substrate 170' such as a printed circuit board or laminated substrate. A chip stack is formed over the base substrate in which the chip stack includes a chip 160' formed with the 3D interconnect structure. In an embodiment, the chip 160' is a logic chip, and one or more memory chips 180, 181 are stacked onto the logic chip 160' with the array of landing pads 154' of the logic chip (underneath an array of conductive bumps) coupled with a corresponding array of landing pads 182 of the memory chip 180, though embodiments are not limited to such and may include a variety of chip-to-chip configurations.

In an embodiment, a via (e.g., TSV) is formed in a via last processing sequence. In such an embodiment, prior to forming the via, a silicon carbide or silicon nitride containing passivation layer may be formed over the back surface of the device wafer. A via opening is then formed in the device wafer between the back surface and the front surface of the device wafer. An insulating liner layer is formed on the sidewalls of the via opening. A barrier layer is formed within the via opening and over the passivation layer, and then a bulk volume of the via may then be filled with a conductive metal such as copper by electroplating, for example. The conductive metal overburden and the barrier layer between via openings is then removed from over the passivation layer by CMP, for example. In this manner, the passivation layer not only can function to prevent moisture and trace metal contaminants from entering the device wafer, but also function as a polish stop layer allowing for a large amount of overpolish to be incorporated into the TSV barrier layer CMP step without causing a significant amount of the passivation layer to also be removed.

Figure 19:
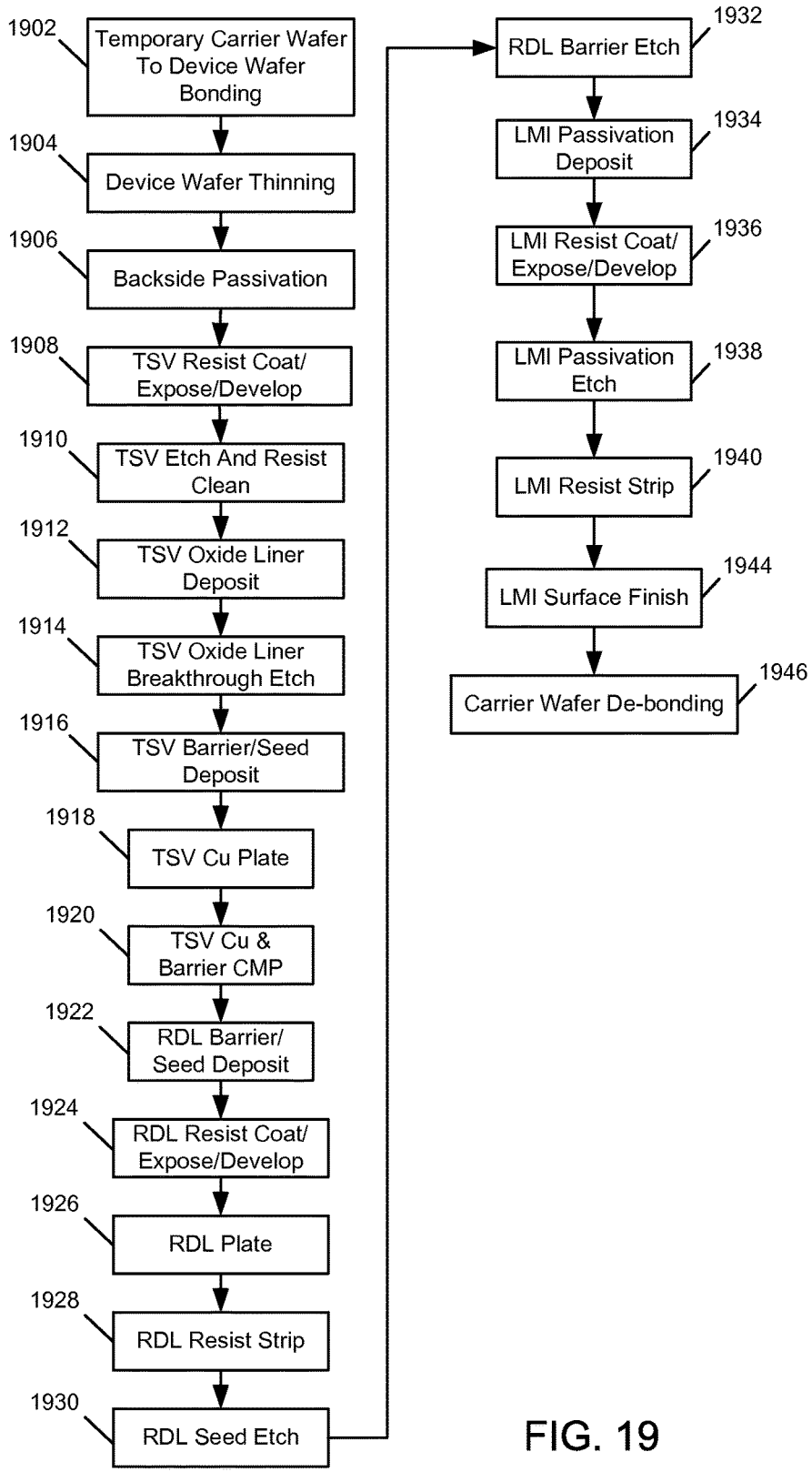
FIG. 19 depicts a process in an embodiment of the invention.

Referring now to FIGS. 1-17 a method of manufacturing a 3D interconnect structure is described with reference to the figures. In conjunction with FIGS. 1-17, reference is also made to process 1900 of FIG. 19.

An inverted device wafer 100 is illustrated in FIG. 1 which may include a front surface 102 and a back surface 104. The device wafer 100 may have a variety of formations. For example, the device wafer may be a bulk semiconductor, include an epitaxial layer overlying a bulk semiconductor, or include a semiconductor-on-insulator (SOI) structure, though other structures may be used. In the particular embodiment illustrated, the device wafer 100 includes a SOI structure including semiconductor layer 116 overlying insulator layer 114, and bulk substrate 118. The device wafer 100 may additionally include doped regions or other doped features to form various microelectronic devices such as metal-insulator-semiconductor field effect transistors (MOSFETs), capacitors, inductors, resistors, diodes, micro-electro-mechanical systems (MEMS), other suitable active or passive devices, and combinations thereof.

A metallization structure 112 may be formed over the front surface 102 of the device wafer 100. As illustrated, metallization structure 112 includes multiple interconnect layers formed of conductive metals such as copper, aluminum, etc. and interlayer dielectric materials such as silicon oxide, carbon doped oxide, silicon nitride, etc. A passivation layer 113 may be formed over an upper portion of the metallization structure 112 to provide physical and chemical protection. One or more conductive pads 108 (e.g. copper, aluminum, etc. which may or may not be formed as bumps) may be provided over the openings in passivation layer 113. The device wafer 100 is bonded to a temporary carrier wafer 200 using a commercially available temporary bonding adhesive 208 and equipment (see block 1902). Device wafer 100 may then be thinned back by grinding, chemical mechanical polishing (CMP), plasma etching and/or wet etching the back surface 104 (see block 1904). For example, device wafer 100 may be thinned back to approximately 20-200 μm in an embodiment (whereas other embodiments may include 20, 50, 100, 150, 200 μm thicknesses and the like). FIG. 1 shows wafer 100 after thinning has occurred.

Figure 2:
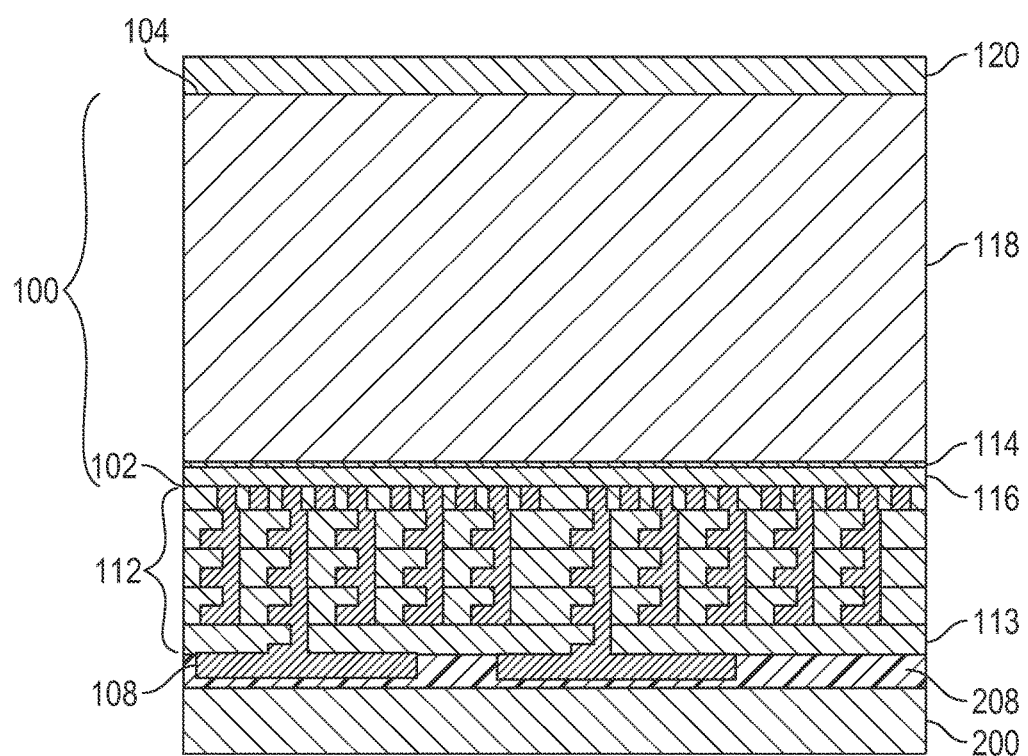

After thinning the device wafer 100 a passivation layer 120 may be formed over the back surface 104 to provide a hermetic barrier, as illustrated in FIG. 2 (see block 1906). Suitable materials for the passivation layer 120 include, for example, silicon carbide and silicon nitride since these materials may provide a hermetic barrier that protects the back side 104 of the thinned device wafer 100 from trace metal and moisture contamination. Silicon carbide and silicon nitride may also possess significantly lower removal rates than subsequently deposited TSV barrier layer materials such as Ta or Ti during subsequent CMP removal of the barrier layer materials from over the passivation layer 120 between TSVs, as described with regard to FIG. 8. Passivation layer 120 may be deposited by suitable methods such as chemical vapor deposition (CVD). Passivation layer 120 may alternatively include multiple layers, such as a silicon nitride/silicon oxide stack or a silicon carbide/silicon oxide stack in which the silicon oxide is formed over the silicon nitride or silicon carbide and may be utilized as a hard-mask at the downstream via opening etch process.

Figure 3:
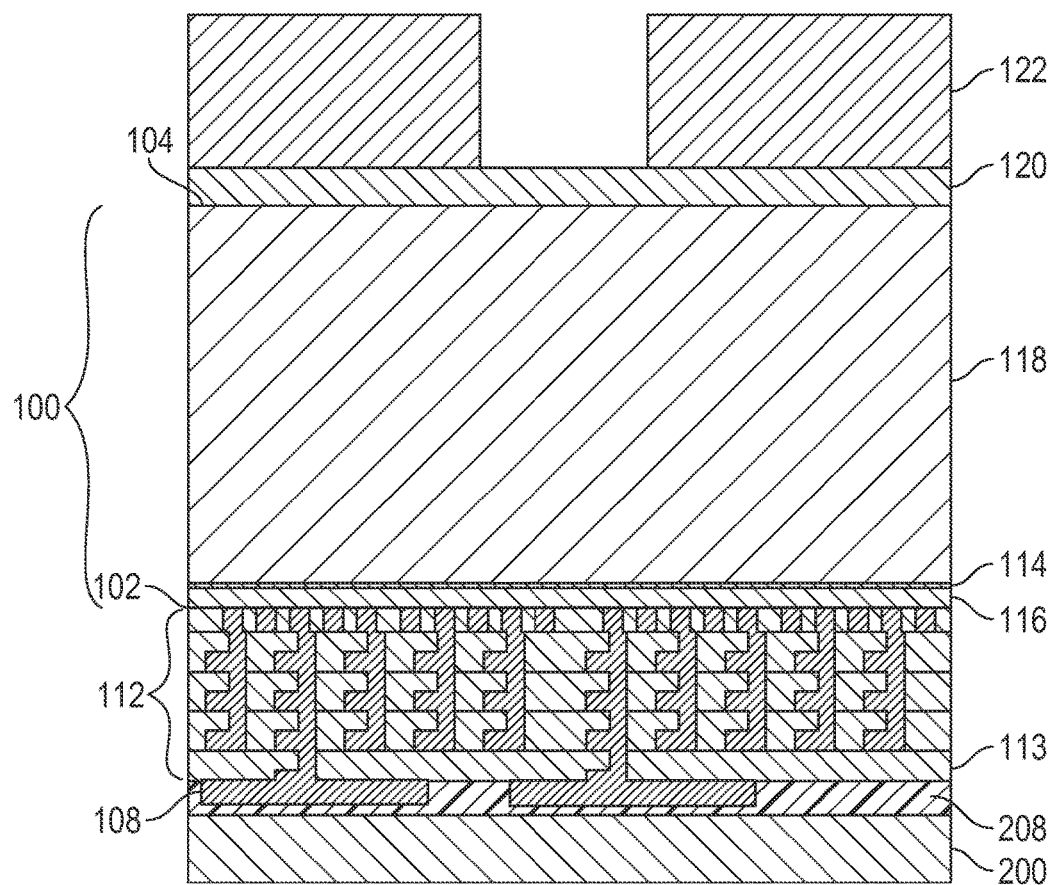

In FIG. 3 a photoresist layer is coated onto the thinned device wafer, exposed and developed (see block 1908, which refers to "TSV" resist because this resist will be used to form a TSV). After developing there are openings in the patterned photoresist layer 122 at those locations where vias (e.g. TSVs) are desired.

Figure 4:
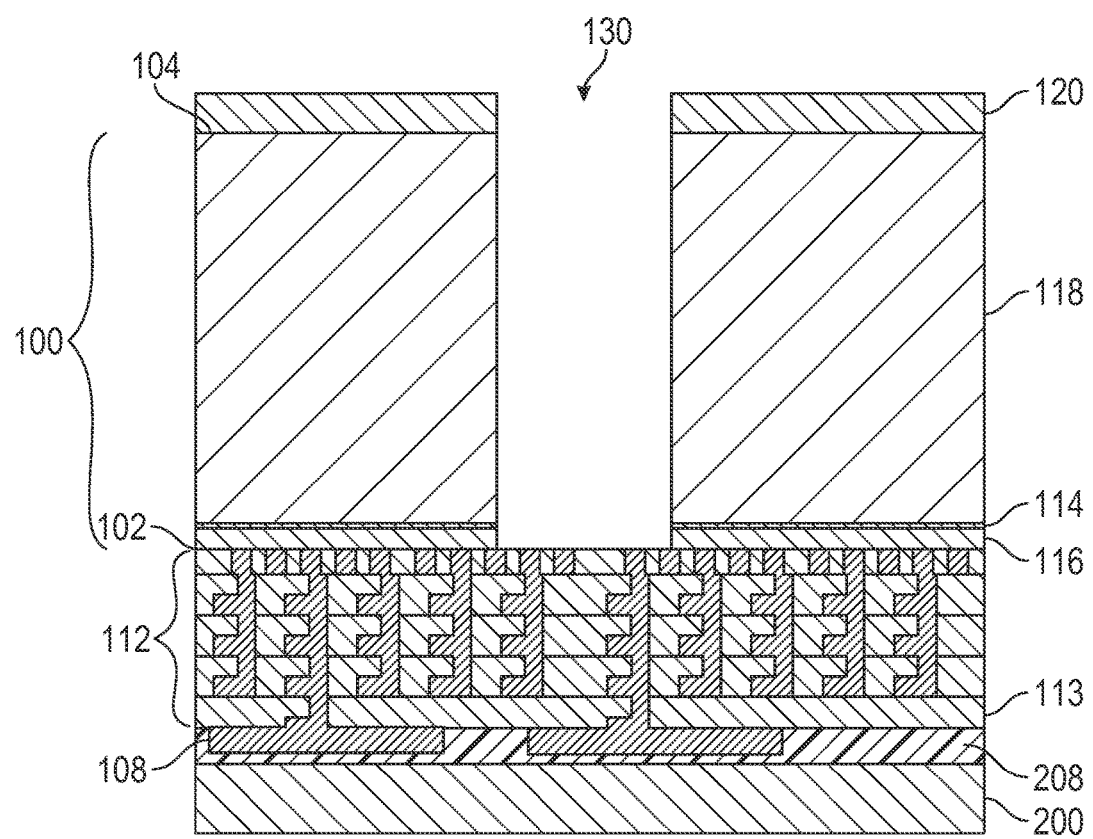

In FIG. 4, a via opening(s) 130 (e.g., TSV opening) is etched using a suitable method such as plasma etching through the passivation layer 120, and through the device wafer 100 between the back surface 104 and front surface 102, stopping on copper landing pads within the metallization structure 112. The patterned photoresist layer 122 is then removed and any remaining etch polymers or residues may be cleaned off (see block 1910).

Figure 5:
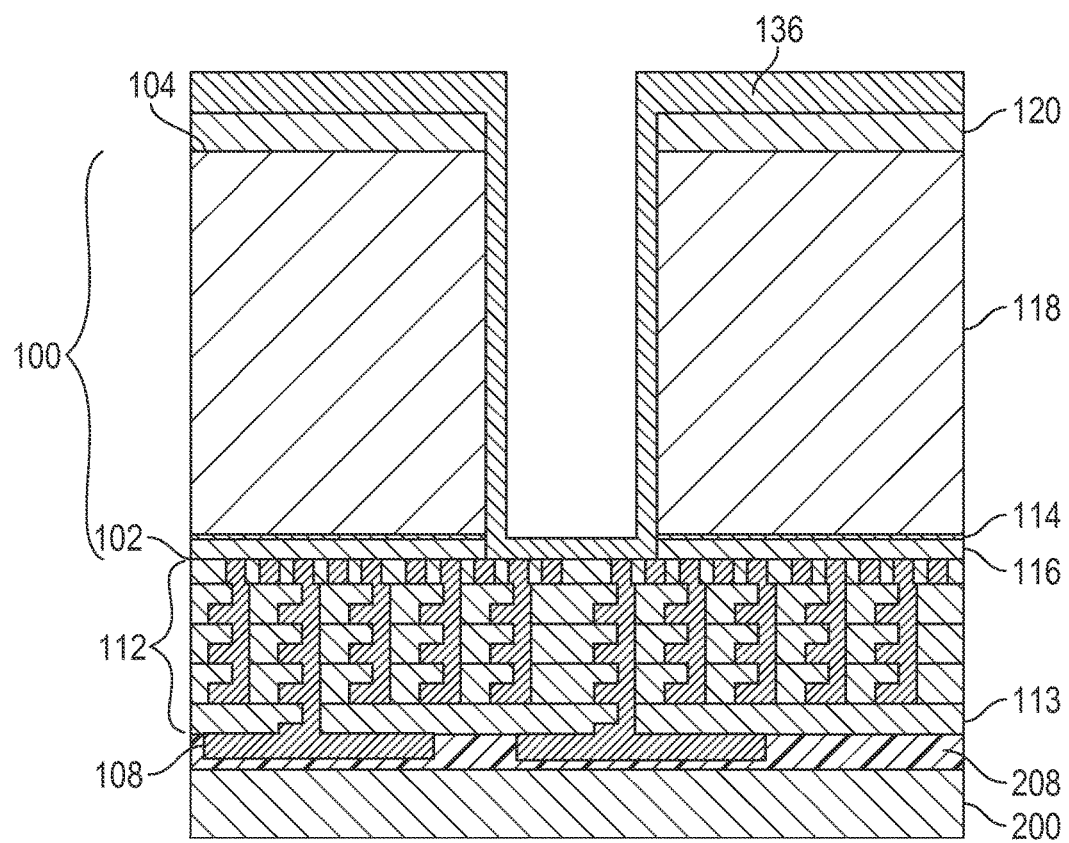

In FIG. 5 an insulating liner layer 136 is then deposited, lining the bottoms and sidewalls of the via opening(s) 130, as well as the regions between via openings over passivation layer 120 (see block 1912). Suitable materials for insulating liner layer 136 include, but are not limited to, silicon dioxide, silicon nitride, silicon carbide, and various polymers. These materials may be deposited by CVD, atomic layer deposition (ALD), and spin coating methods, for example. An anisotropic plasma etch process may then be used to remove the insulating liner layer 136 from the bottom surfaces of the via opening 130, as well as from the regions between via openings over passivation layer 120, while retaining a substantial thickness of the insulating liner layer 136 on the side surfaces of the via openings 130 (see block 1914). In such an embodiment, the insulating liner layer 136 may be formed directly on the via opening 130 sidewalls defined by the bulk silicon substrate 118. Thus, the insulating liner layer 136 functions in the final 3D interconnect structure to insulate the TSV from the surrounding silicon substrate material.

Figure 6:
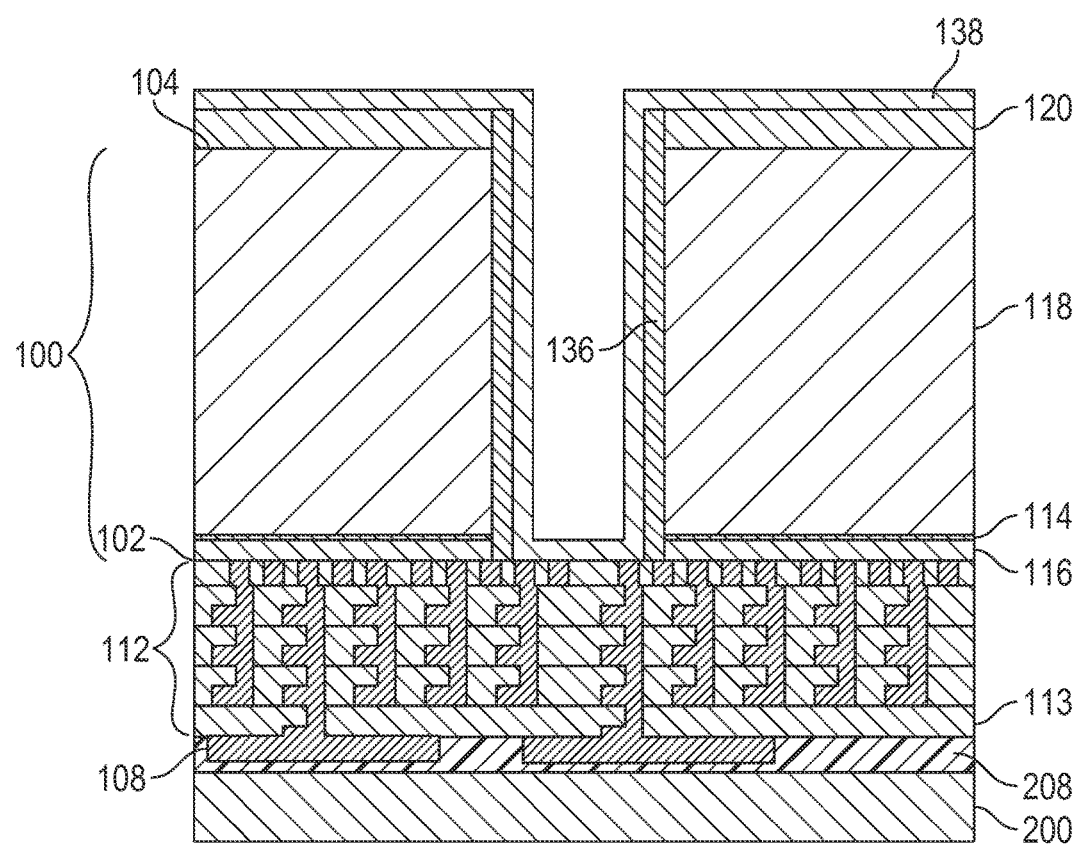

In FIG. 6 a barrier layer and seed layer 138 may then be deposited onto the device wafer surface (see block 1916). For simplicity of illustration, the barrier and seed layers are illustrated as one layer but may in fact be formed with the barrier layer first being formed followed by the seed layer being formed on the barrier layer). Barrier layer 138 may include, for example, tantalum, titanium, or cobalt. The seed layer may be, for example, copper (as dictated by the material to be used to plate the via).

Figure 7:
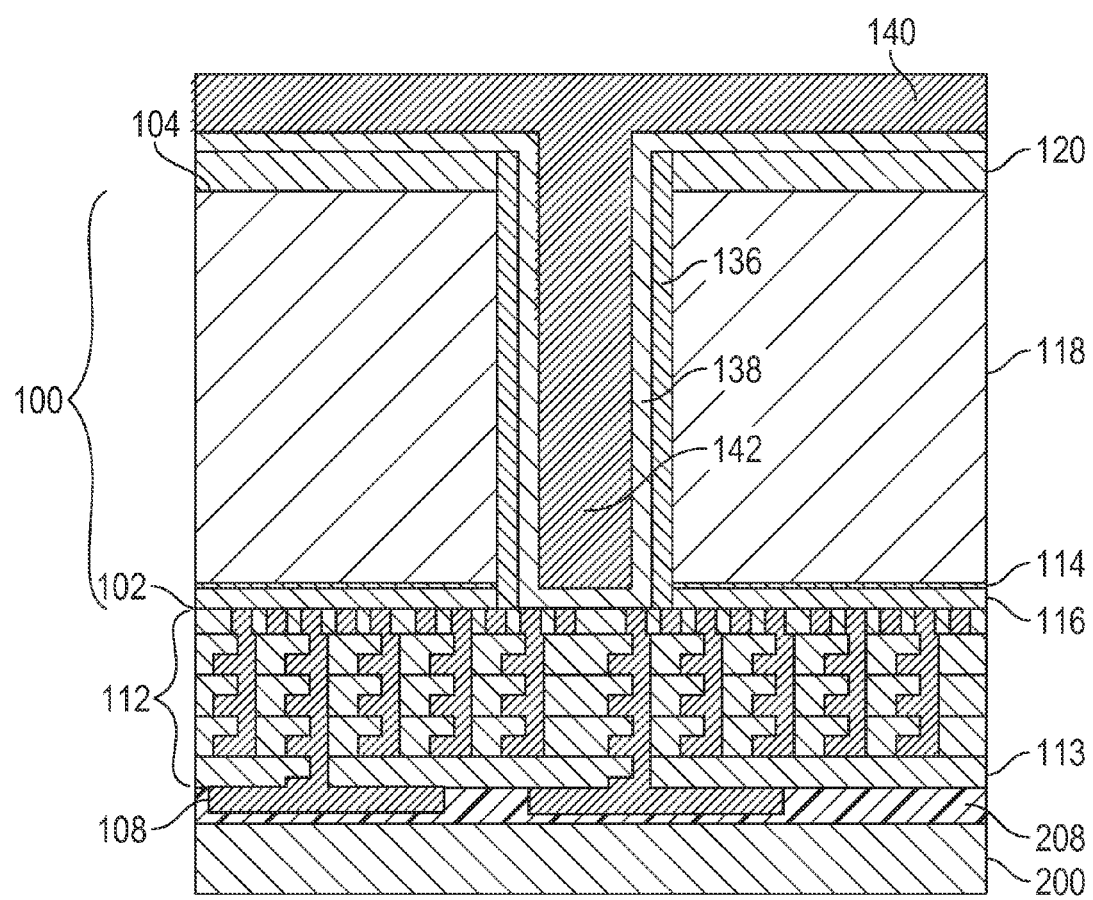
Figure 8:
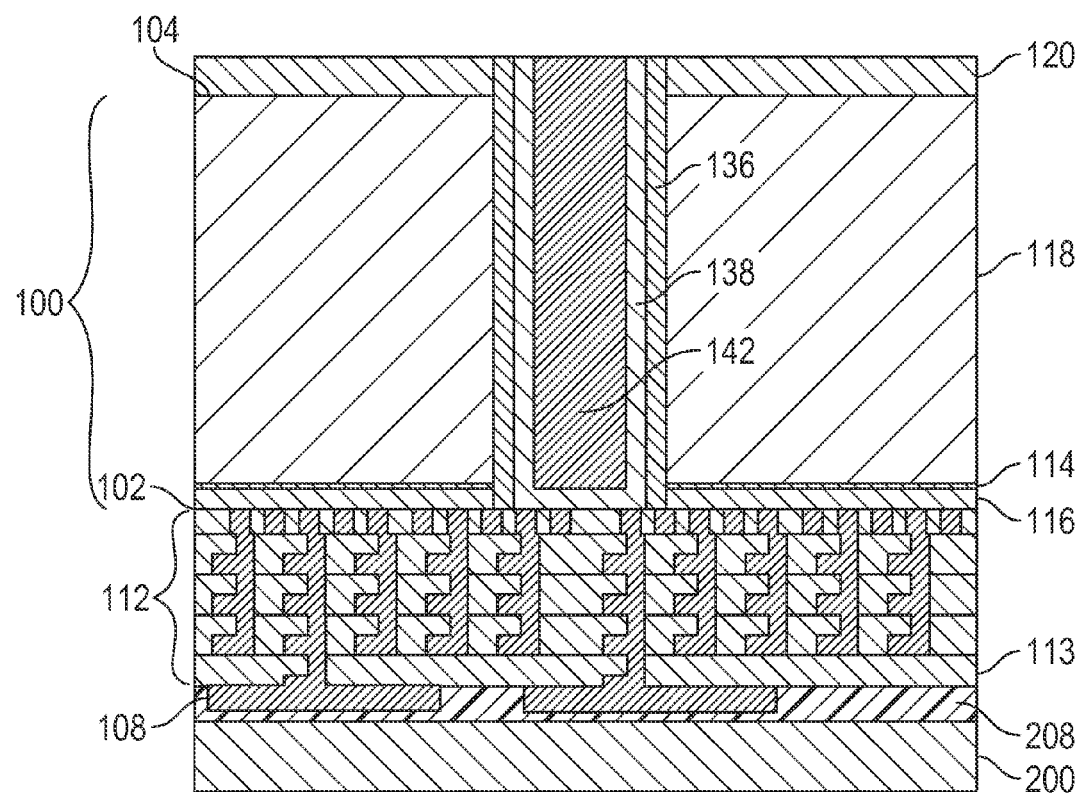

In FIG. 7 a layer of copper 140 is then electroplated onto the device wafer surface, completely filling the TSV openings 130 with copper (see block 1918). The copper overburden and the barrier layer over passivation layer 120 are then removed by CMP, as illustrated in FIG. 8 (see block 1920). The resultant structure includes TSVs 142 which extend through the device wafer 100 between the front 102 and back 104 surfaces. In such a configuration a single metal fill 140 occupies the bulk volume of the TSVs 142, which may be lined with barrier layer and seed layer 138 (e.g., for electroplating of the eventual RDL) and the insulating liner layer 136.

In an embodiment, the copper 140 overburden is removed in a first CMP operation with a first slurry, followed by removal of the barrier layer 138 from over the passivation layer 120 in a second CMP operation with a second slurry which is different from the first slurry. Commercially available CMP slurries for barrier layer 138 removal are engineered to etch barrier materials such as Ta, Ti, TaN and TiN, and are also typically engineered to etch oxide. In accordance with embodiments of the present invention, passivation layer 120 may function as a polish stop during removal of the barrier layer 138 which allows for the barrier layer 138 CMP operation to incorporate a large amount of overpolish without causing a significant amount of the passivation layer 120 to be removed.

Figure 9:
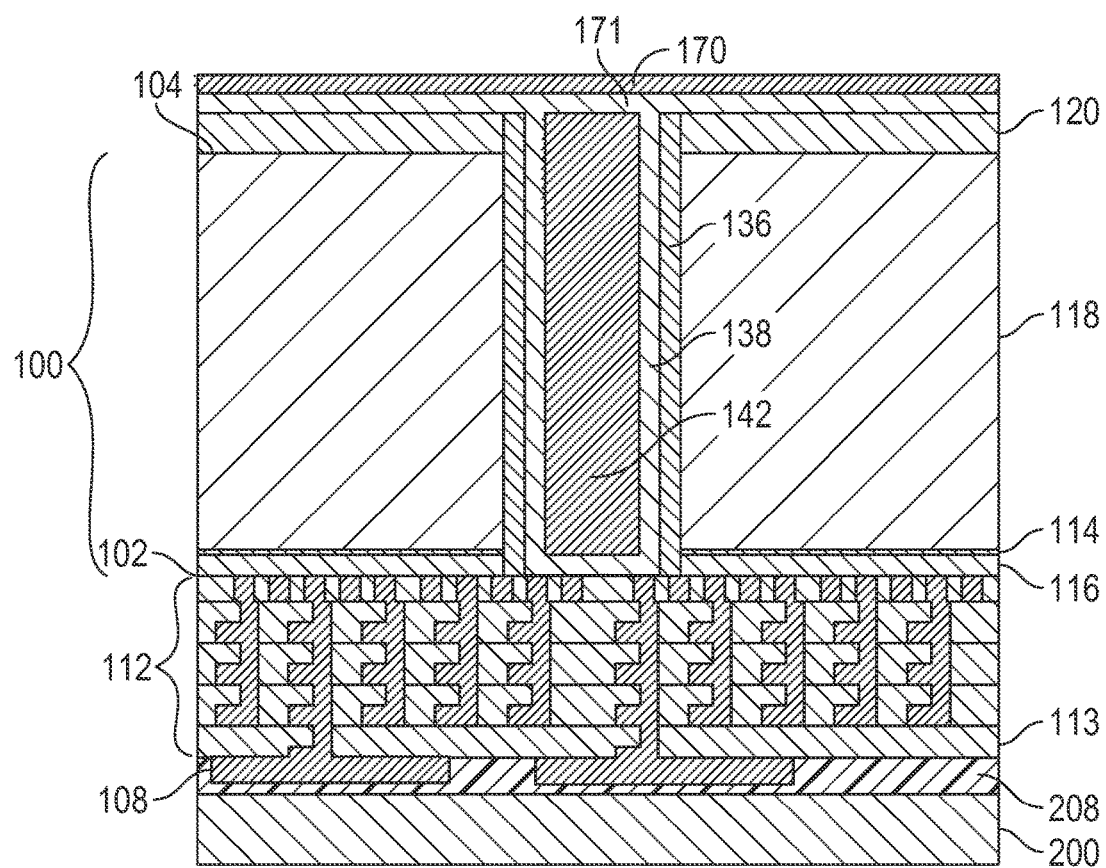

In FIG. 9 a barrier layer 171 and seed layer 170 may then be deposited onto the device wafer surface (see block 1922, which refers to "RDL" barrier/seed because these layers will be used to form the RDL). For example, the barrier layer 171 may include Ta, Ti, TaN, TiN. The seed layer 170 may be, for example, copper.

Figure 10:
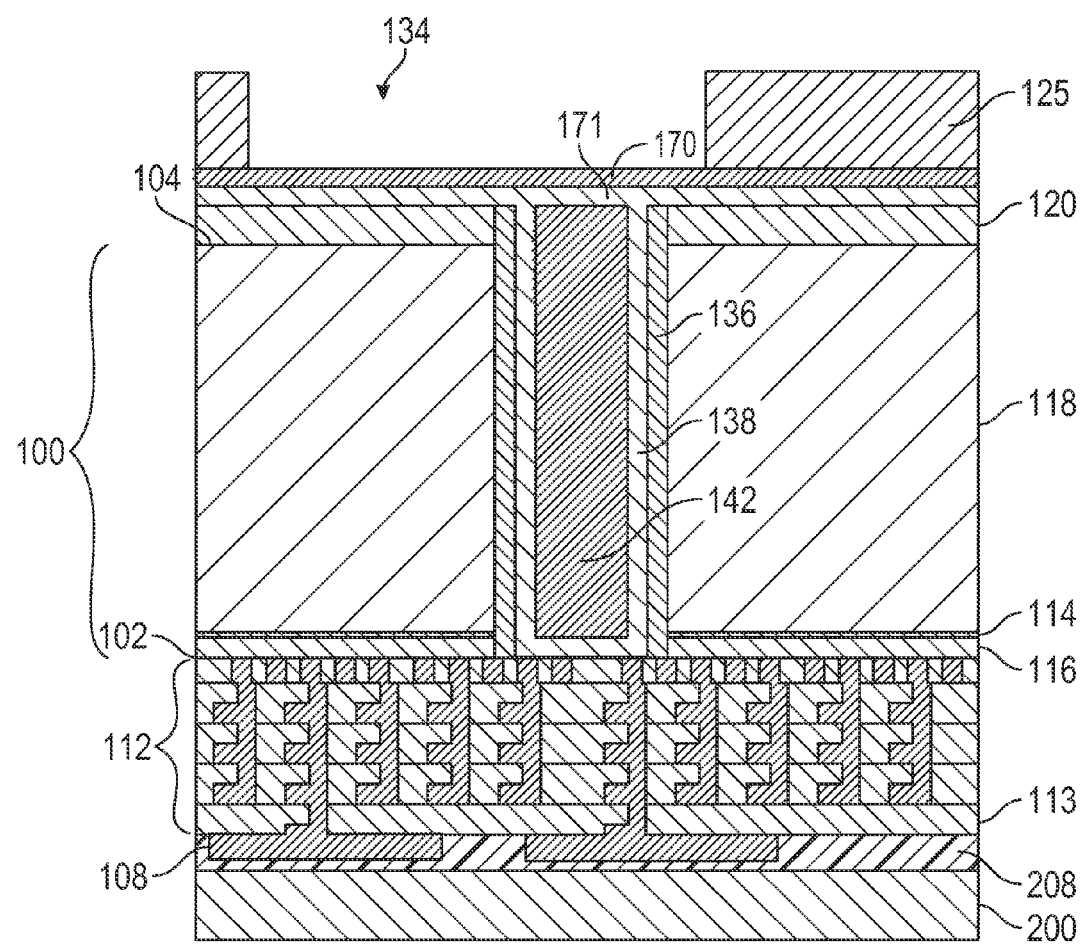

In FIG. 10 a photoresist material is coated onto the seed layer 170, and then exposed and developed (see block 1924). After developing the resist there are openings (e.g., opening 134) in the resist coating at those locations where fine pitch metal RDL lines are desired, as illustrated in FIG. 10.

Figure 11:
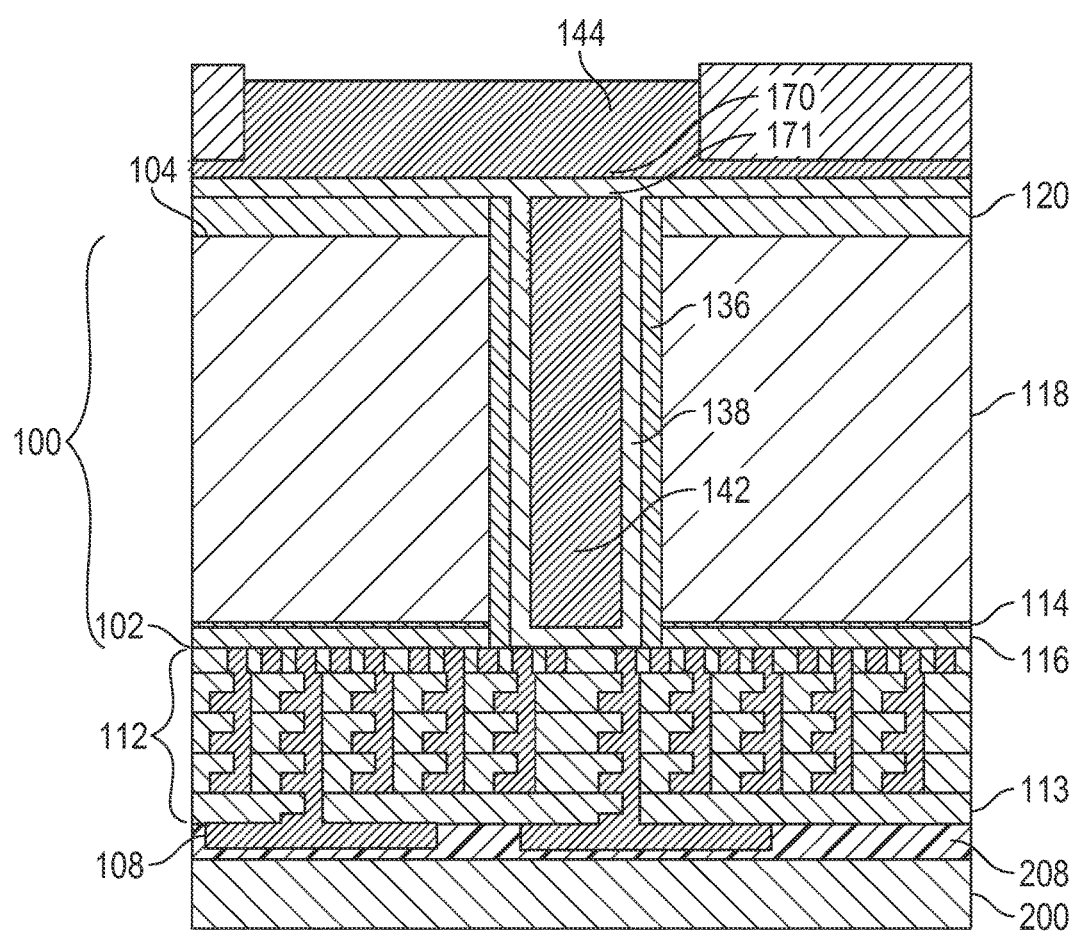

In FIG. 11, a layer of copper 144 is then electroplated onto the seed layer 170, filling opening 134 with copper (see block 1926) and forming the desired fine pitch metal RDL lines. Thus, opening 124 in resist 125 provides for a "plate through resist" operation instead of single or dual damascene processing.

Figure 12:
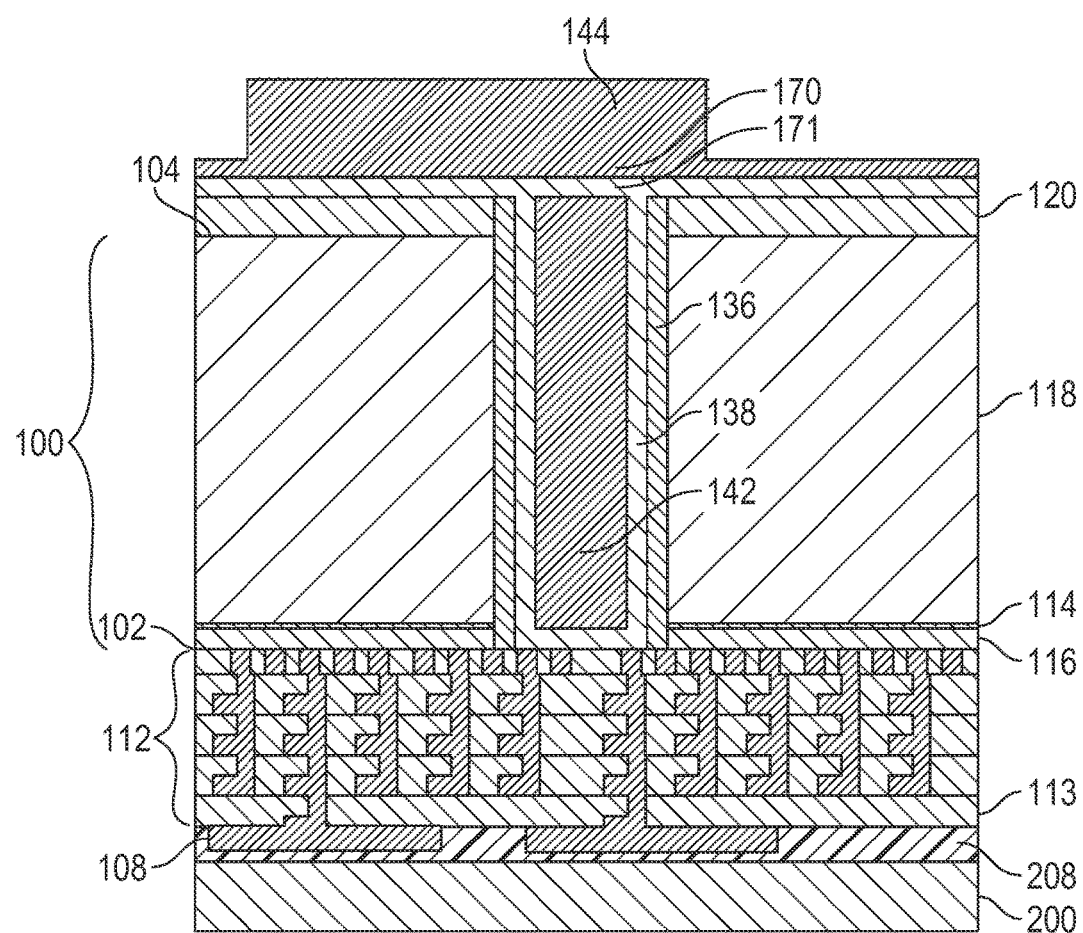

In FIG. 12 the redistribution photoresist layer is removed and any remaining residue is cleaned off of the wafer surface (see block 1928). The resultant RDL 144 may include a landing pad, where the via 142 is not directly underneath the landing pad, and may be lined with barrier layer and seed layer 138. Thus, due to the use of plate through resist to produce RDL 144 in FIG. 11, no CMP step is needed to remove Cu overburden (as would be needed in single and dual damascene RDL formation techniques or flows). This results in a cost and time savings for the process.

Figure 13:
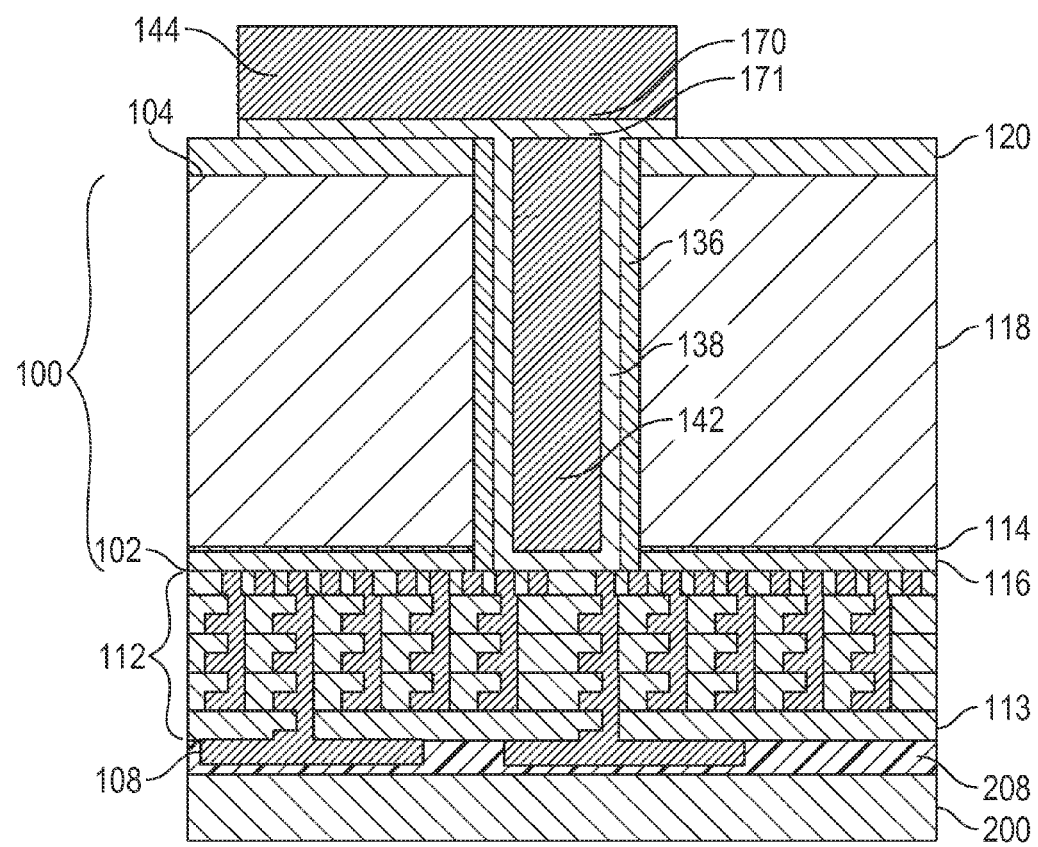

In FIG. 13 the thin copper seed layer 170 in between the fine pitch redistribution lines (only one of which is shown with the understanding that additional RDL lines may be located to the left, right, behind, or in front of the cross-section view of RDL 144) is removed using wet or dry etch processing (see block 1930). Suitable wet etchants consist of ferric chloride or sulfuric acid/hydrogen peroxide mixtures. Suitable dry etch processing includes argon sputtering. The thin titanium barrier 171 layer in between the fine pitch redistribution lines is removed using wet or dry etch processing (see block 1932).

Figure 14:
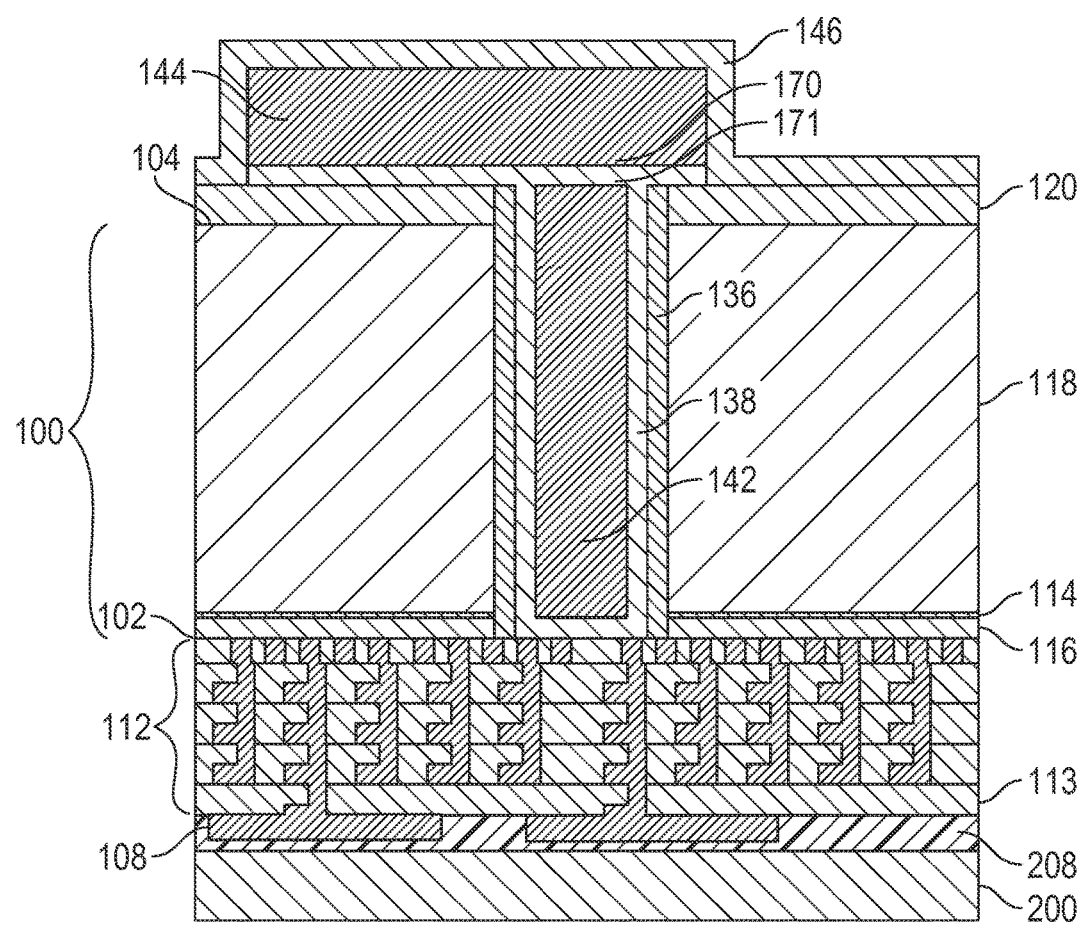
Figure 15:
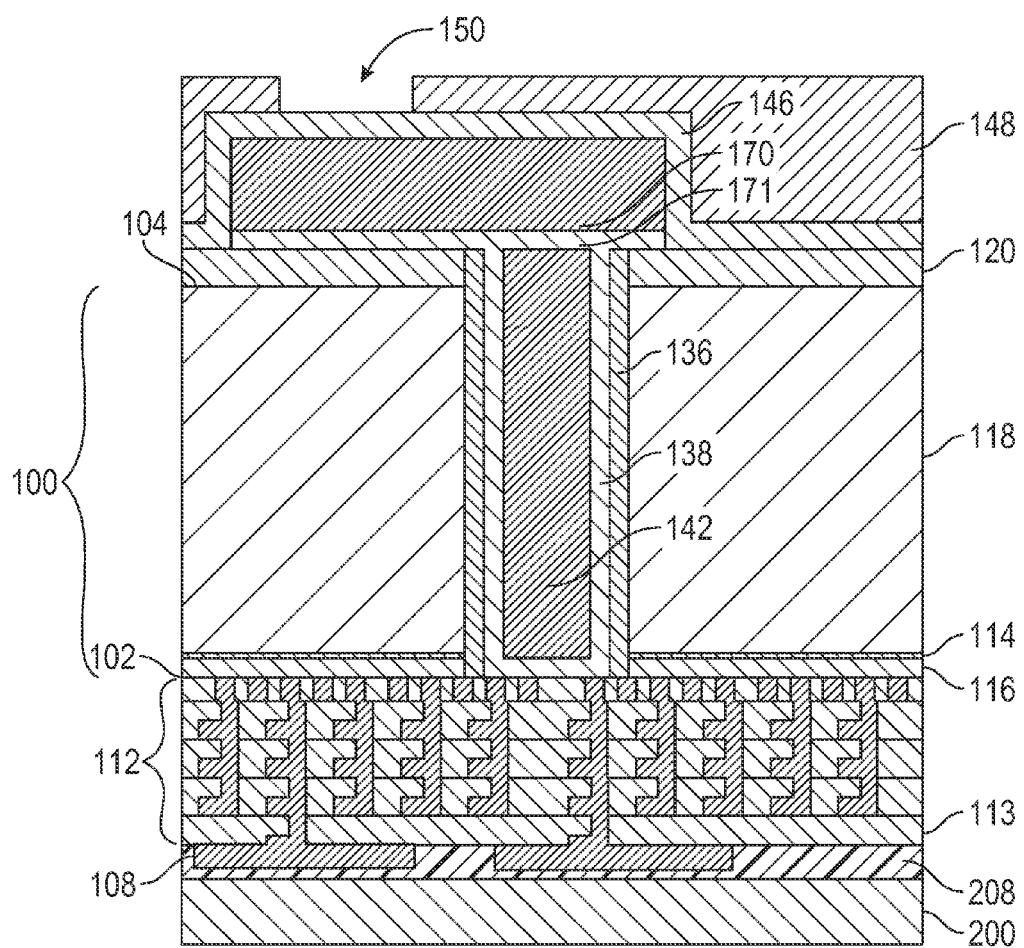
Figure 16:
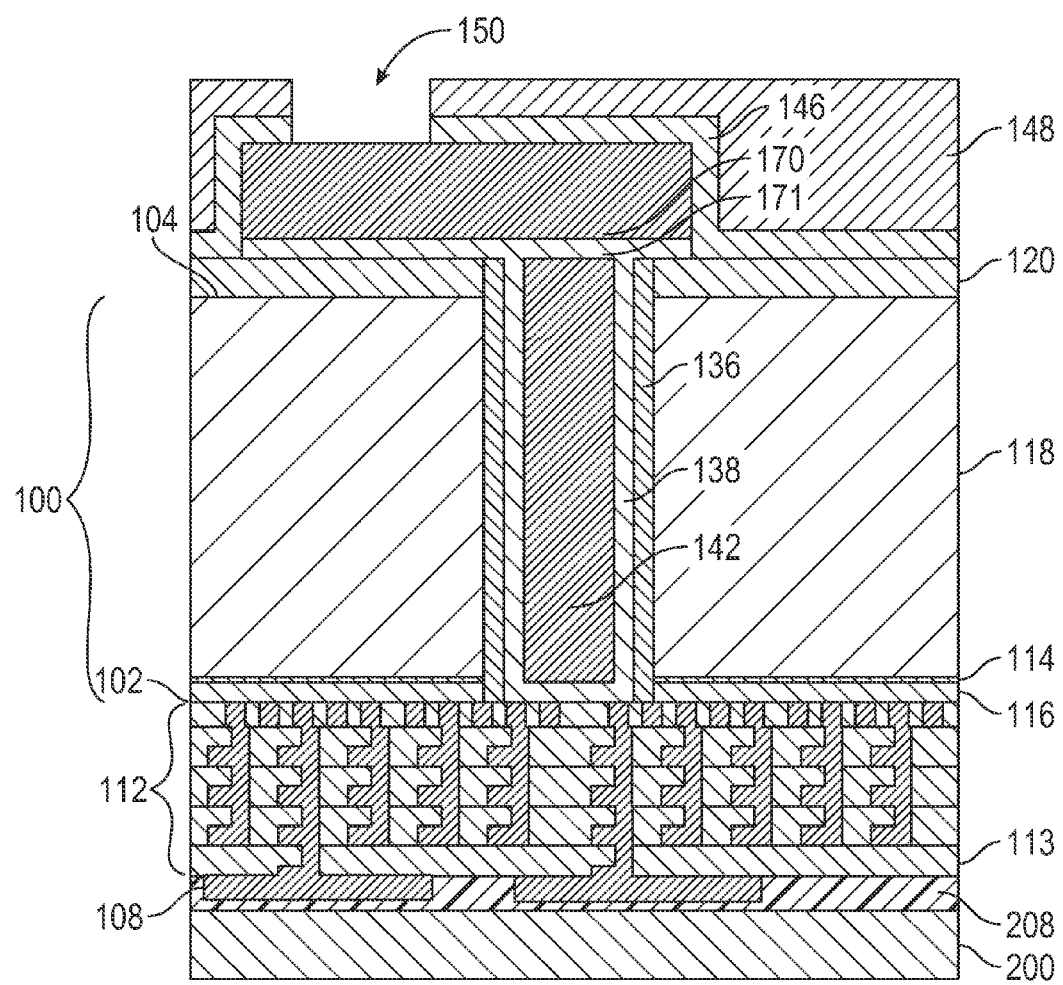

Referring now to FIG. 14, passivation layer 146 is deposited over RDL 144 (see block 1934, which refers to "LMI" passivation because this passivation layer will be used to create a logic-memory interface (LMI) between logic chip 160 and a memory chip addressed with FIGS. 17 and 18). Suitable materials include, but are not limited to, silicon nitride which may provide a hermetic barrier that protects against trace metal and moisture contamination, as well as protect the RDLs 144 from oxidation. In FIG. 15 a photoresist material is then coated over the passivation layer 146, exposed and developed to form a patterned photoresist layer 148 (see block 1936). After developing the resist there are openings 150 in the photoresist layer 148 at those locations where the RDLs 144 are to terminate at landing pads to which chip-to-chip connections are desired. In FIG. 16 openings are then etched through the passivation layer 146 using a suitable technique such as plasma etching using the patterned photoresist layer 148 as a mask, stopping on the underlying RDL 144 landing pads (see block 1938).

In FIG. 17 the photoresist layer 148 is then removed and any remaining etch polymer or residues may be cleaned off (see block 1940). Conductive bump 154 is formed over each of the exposed RDL 144 landing pads (see block 1944). Any suitable technique may be implemented to form conductive bump 154 such as, but not limited to, solder bumping, electroplating using a patterning process, and electroless plating.

In the particular embodiment illustrated in FIG. 17, the exposed RDL 144 landing pads (i.e., area located between passivation layer gap that permits contact to top surface of RDL line) are coated with a solder-compatible surface finish 155. Exemplary surface finishes for conductive bump(s) 154 include electroless CoP/immersion Au, electroless CoWP/immersion Au, electroless NiP/immersion Au, electroless NiP/electroless Pd/immersion Au, electroless Sn, electroless NiP/electroless Sn, electroless CoP/electroless Sn, electroless CoWP/electroless Sn, electroless Cu/electroless CoP/immersion Au, electroless Cu/electroless CoWP/immersion Au, electroless Cu/electroless NiP/immersion Au, electroless Cu/electroless NiP/electroless Pd/immersion Au, electroless Cu/electroless Sn, electroless Cu/electroless NiP/electroless Sn, electroless Cu/electroless CoP/immersion Au, electroless Cu/electroless CoWP/electroless Sn. Other surface finishes may also be suitable depending upon the chip-to-chip solder material(s) and/or chip-to-chip attachment methods that are employed. In another embodiment, the conductive bump 154 may be a C4 or flip-chip bump formed of a material such as PbSn, Sn, SnAg, Cu, In, SnAgCu, SnCu, Au, etc.

The carrier wafer 200 and adhesive 208 may then removed from the device wafer 100 utilizing commercially available wafer de-bonding equipment and processing (see block 1946). Upon removal of the carrier wafer 200 and adhesive 208, the resulting plurality of 3D interconnect structures 160 illustrated in FIG. 17 may be singulated, and then may or may not be further processed to form chips, which may then be integrated into 3D packaging structures.

While embodiments of the invention have been described in which the array of TSVs are not directly underneath the array of landing pads and/or conductive bumps, it is to be appreciated that some of the TSVs may be directly underneath the array of landing pads and/or conductive bumps. Embodiments of the present invention provide flexibility for the location of the TSVs by the integration of plate through resist processing. As a result, it is not required that the location of the array of TSVs be directly underneath the corresponding array of landing pads and/or conductive bumps to which the TSVs are connected.

In order to further illustrate the ability of embodiments of the present invention to allow for circuitry design flexibility, in one example, an array of landing pads may have a vertical pitch of 50 μm and a horizontal pitch of 40 μm, and the landing pads (such as the illustrated portion of RDL 144 in FIG. 17) have a diameter of 20 μm. This leaves 30 μm to run six RDLs between two rows of landing pads in one particular example. Assuming that the six RDL line widths and the seven spaces adjacent and between the RDLs are the same, each RDL may have a line width of 2.3 μm (however other embodiments may include line widths of 2, 3, 4, 5, 6, 7, 8 μm or more). Plate through resist type processing in accordance with embodiments of the invention may be particularly suitable for accomplishing such exemplary fine pitch RDL architecture, though embodiments are not so limited and may also be used for any pitch of RDL architecture.

Figure 20:
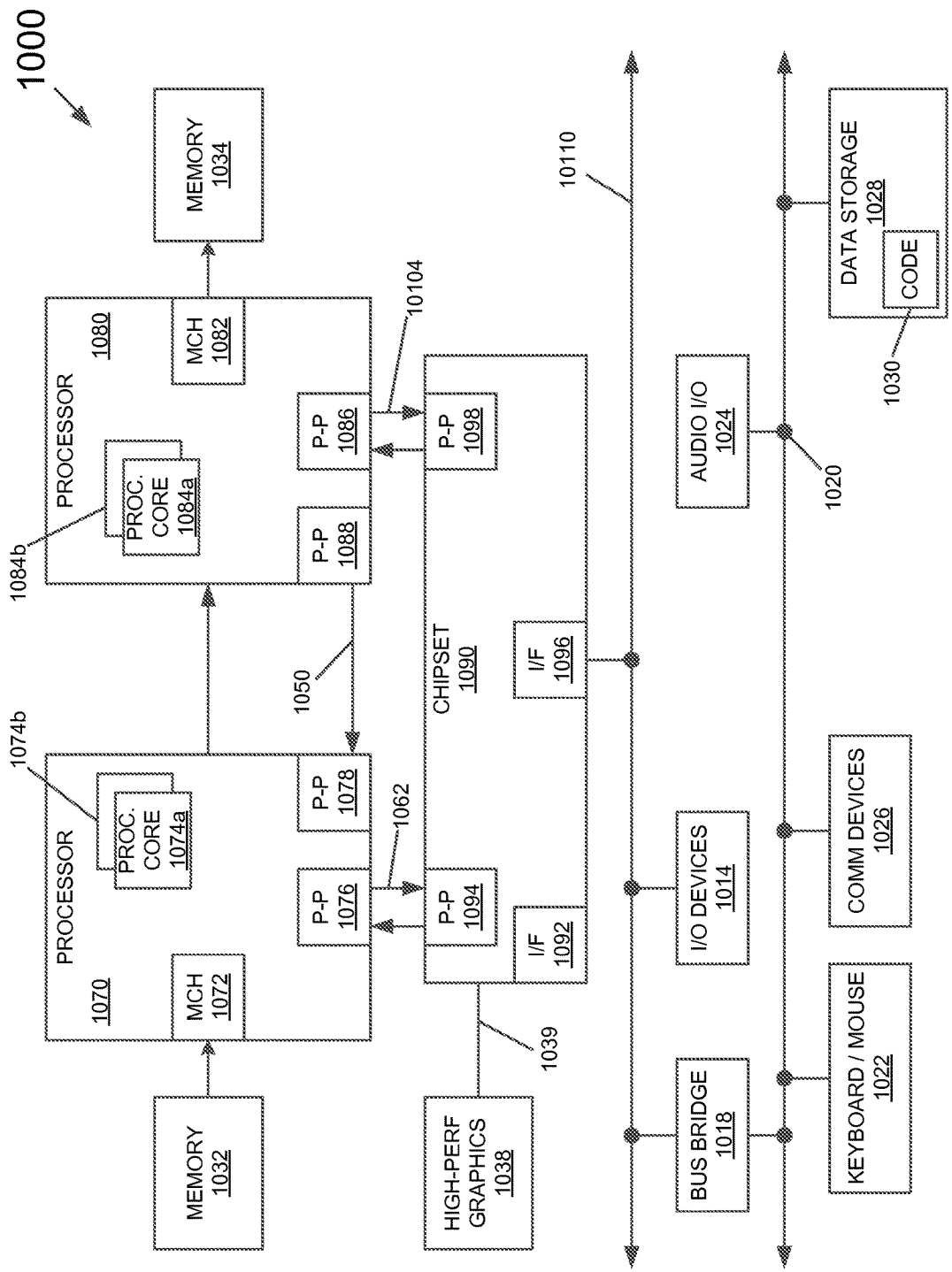
FIG. 20 represents a system in accordance with embodiments of the invention.

Referring now to FIG. 20, shown is a block diagram of a system embodiment 1000 in accordance with an embodiment of the present invention. Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code in a manner similar to methods discussed herein.

Each processing element 1070, 1080 may include at least one shared cache. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of the Figure may alternatively be partitioned using more or fewer integrated chips than shown in the Figure.

One or more of the components shown in system 300 may be included in/and or may include one or more integrated circuit semiconductor packages, such as a chip 160 of FIG. 17 or 3D package of FIG. 18 for example. For example, components 1070, 1080, 1032, 1034, 1038, 1090 or a combination of these components may be included in an integrated circuit package that includes at least one embodiment of an interconnect structure described in the various embodiments.

Example 1 includes an interconnect apparatus comprising: a semiconductor substrate having a front and back surfaces; a via extending from the front surface to the back surface; a redistribution layer (RDL) formed over the back surface and the via; and a first passivation layer directly contacting a side surface of the RDL.

The RDL may compose a landing pad, which may constitute a portion of an extended RDL line (also referred to as RDL), and the like. The RDL may not be in direct contact with the back surface of the substrate. While some embodiments include Cu or Au for the RDLs, other embodiments are not so limited and may include other metals and/or alloys not specifically mentioned. When one element "directly contacts" another element such contact still exists despite there being some level of oxidation or contamination between the two elements (e.g., between a passivation layer and an RDL). This is true for other areas herein that refer to "direct contact". Further, the seed layer may include the same material as the RDL line despite doing so in a different manner than the RDL line (e.g., the seed layer may be an alloy of the material used for the RDL line and vice versa, the seed layer may include different proportions of materials (albeit the same materials) as the RDL line, and the like). At times herein an RDL line may be referred to as an RDL layer (and vice versa). However, doing so merely connotes that many of the RDL lines are formed from a single layer. An RDL layer, after it has been patterned, may include many RDL lines.

In example 2 the subject matter of the Example 1 can optionally include wherein the first passivation layer directly contacts a top surface of the RDL.

In example 3 the subject matter of the Examples 1-2 can optionally include a second passivation layer disposed (a) between the back surface and the RDL, and (b) below the first passivation layer.

In example 4 the subject matter of the Examples 1-3 can optionally include wherein the first passivation layer comprises at least one of silicon carbide and silicon nitride and the second passivation layer comprises at least one of silicon carbide and silicon nitride.

In example 5 the subject matter of the Examples 1-4 can optionally include wherein the via further comprises: an insulating liner layer directly contacting a side surface of the via; a barrier layer within the via and directly contacting the insulating liner; and a conductive metal filling the via.

In example 6 the subject matter of the Examples 1-5 can optionally include a barrier layer between the RDL and the via; and a seed layer between the barrier layer and the RDL, the seed layer and the RDL including a conductive material; wherein the barrier and seed layers are vertically aligned with the via.

In example 7 the subject matter of the Examples 1-6 can optionally include an array of landing pads arranged over the back surface in a series of rows and columns; an array of through-silicon vias (TSVs), including the via, arranged under the back surface such that the array of TSVs is not directly underneath the array of landing pads; and a plurality of RDLs running between two of the rows of the landing pads connecting one of the two rows to a corresponding number of TSVs in the array of TSVs.

In example 8 the subject matter of the Examples 1-7 can optionally include wherein the two rows of the landing pads are separated by a pitch of 10 μm to 500 μm.

In example 9 the subject matter of the Examples 1-8 can optionally include wherein the RDL includes a patterned RDL line having two RDL sidewalls and a RDL line width, orthogonal to and extending between the two RDL sidewalls that is less than 5 microns. In other embodiments the width may be 2, 3, 4, 6, 7, 8 or more microns.

In example 10 the subject matter of the Examples 1-9 can optionally include a surface finish layer (a) vertically aligned over a contact pad portion of the RDL, and (b) vertically offset from the via. The surface finish layer may be formed on a bump that directly or indirectly contacts the landing pad or contact pad portion of the RDL.

In example 11 the subject matter of the Examples 1-10 can optionally include wherein the first and second passivation layers hermetically seal the substrate.

In example 12 the subject matter of the Examples 1-11 can optionally include wherein the first passivation layer is vertically aligned with the via. By "vertically aligned" a vertical axis, centered within the via extend between the top and bottom of the via, would intersect a portion of the first passivation layer.

Example 13 includes a semiconductor package comprising: a base substrate; and a chip stack formed over the base substrate; wherein the chip stack includes a chip comprising: a semiconductor substrate having a front surface and a back surface; a via extending from the front surface to the back surface; a redistribution layer (RDL) formed over the back surface and the via; and a first passivation layer directly contacting a side surface of the RDL.

In example 14 the subject matter of the Example 13 can optionally include wherein the chip is a logic chip.

In example 15 the subject matter of the Examples 13-14 can optionally include wherein the logic chip further comprises: an array of landing pads arranged over the back surface in a series of rows and columns; an array of through-silicon vias (TSVs) arranged under the back surface such that the array of TSVs is not directly underneath the array of landing pads; and a plurality of RDLs running between two of the rows of the landing pads connecting one of the two rows to a corresponding number of TSVs in the array of TSVs.

In example 16 the subject matter of the Examples 13-15 can optionally include wherein the array of landing pads are coupled with a corresponding array of landing pads of a memory chip.

Example 17 includes a method of forming an interconnect structure comprising: providing a semiconductor substrate having front and back surfaces; forming a via extending from the front surface to the back surface; forming a redistribution layer (RDL) over the back surface and the via; and forming a first passivation layer directly contacting a side surface of the RDL.

In example 18 the subject matter of the Example 17 can optionally include forming the RDL using plate through resist processing.

In example 19 the subject matter of the Examples 17-18 can optionally include forming the RDL without single or dual damascene processing.

In example 20 the subject matter of the Examples 17-19 can optionally include forming a top surface of the RDL without using chemical mechanical polishing (CMP).

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An interconnect apparatus comprising:
   a semiconductor substrate having front and back surfaces;
   a via extending from the front surface to the back surface;
   a redistribution layer (RDL) formed over the back surface and the via;
   a first passivation layer directly contacting a side surface of the RDL;
   a second passivation layer disposed between the back surface and the RDL;
   wherein the first passivation layer directly contacts a top surface of the RDL;
   wherein the second passivation layer is disposed below the first passivation layer;
   wherein the via further comprises:
      an insulating liner layer directly contacting a side surface of the via;
      a barrier layer within the via and directly contacting the insulating liner; and
      a conductive metal filling the via;
   wherein the barrier layer is between the second passivation layer and the RDL such that a vertical axis intersects the barrier layer, the second passivation layer, and the RDL.

2. An interconnect apparatus comprising:
   a semiconductor substrate having front and back surfaces;
   a via extending from the front surface to the back surface;
   a redistribution layer (RDL) formed over the back surface and the via;
   a first passivation layer directly contacting a side surface of the RDL;
   a second passivation layer disposed between the back surface and the RDL;
   a barrier layer between the RDL and the via; and
   a seed layer between the barrier layer and the RDL, the seed layer and the RDL including a conductive material;
   wherein the barrier and seed layers are vertically aligned with the via and between the via and the RDL such that a vertical axis intersects the RDL, the via, and the barrier and seed layers.

3. The apparatus of claim 2, wherein the first passivation layer directly contacts a top surface of the RDL.

4. The apparatus of claim 3, wherein the second passivation layer is disposed below the first passivation layer.

5. The apparatus of claim 4, wherein the first passivation layer comprises at least one of silicon carbide and silicon nitride and the second passivation layer comprises at least one of silicon carbide and silicon nitride.

6. The apparatus of claim 4, wherein the via further comprises:
   an insulating liner layer directly contacting a side surface of the via;
   the barrier layer within the via and directly contacting the insulating liner; and
   a conductive metal filling the via.

7. The apparatus of claim 6 wherein the barrier layer is between the second passivation layer and the RDL such that an additional vertical axis intersects the barrier layer, the second passivation layer, and the RDL.

8. The apparatus of claim 7 wherein the additional vertical axis intersects the first passivation layer.

9. The apparatus of claim 4, further comprising:
an array of landing pads arranged over the back surface in a series of rows and columns;
an array of through-silicon vias (TSVs), including the via, arranged under the back surface such that the array of TSVs is not directly underneath the array of landing pads; and
a plurality of RDLs running between two of the rows of the landing pads connecting one of the two rows to a corresponding number of TSVs in the array of TSVs.

10. The apparatus of claim 9, wherein the two rows of the landing pads are separated by a pitch of 10 μm to 500 μm and are adjacent one another with no other row of landing pads between the two rows.

11. The apparatus of claim 4, wherein the RDL includes a patterned RDL line having two RDL sidewalls and a RDL line width, orthogonal to and extending between the two RDL sidewalls, that is less than 5 microns.

12. The apparatus of claim 4 comprising a surface finish layer (a) vertically aligned over a contact pad portion of the RDL, and (b) vertically offset from the via.

13. The apparatus of claim 3, wherein the first passivation layer is vertically aligned with the via such that the vertical axis intersects the first passivation layer and the via.

14. The apparatus of claim 2 wherein at least one of the barrier layer and the seed layer is between the second passivation layer and the RDL.

15. A semiconductor package comprising:
a base substrate; and
a chip stack formed over the base substrate;
wherein the chip stack includes a chip comprising:
a semiconductor substrate having front and back surfaces;
a via extending from the front surface to the back surface;
a redistribution layer (RDL) formed over the back surface and the via;
a first passivation layer directly contacting a side surface of the RDL; and
an array of landing pads that are: (a) coupled with a corresponding array of landing pads of a memory chip, and (b) arranged over the back surface in a series of rows and columns;
an array of through-silicon vias (TSVs) arranged under the back surface such that the array of TSVs is not directly underneath the array of landing pads; and
a plurality of RDLs running between two of the rows of the landing pads connecting one of the two rows to a corresponding number of TSVs in the array of TSVs.

16. The package of claim 15, wherein the chip is a logic chip.

* * * * *